(12) United States Patent
Kogan et al.

(10) Patent No.: US 6,825,680 B1
(45) Date of Patent: Nov. 30, 2004

(54) AUTOMATED SEMICONDUCTOR PROBING DEVICE

(75) Inventors: Yakov Kogan, Wayland, MA (US); Parviz Tayebati, Boston, MA (US); Daryoosh Vakhshoori, Cambridge, MA (US)

(73) Assignee: Nortel Networks Limited (CA)

( * ) Notice: Subject to any disclaimer, the term of this patent is extended or adjusted under 35 U.S.C. 154(b) by 61 days.

(21) Appl. No.: 09/885,362

(22) Filed: Jun. 20, 2001

Related U.S. Application Data

(60) Provisional application No. 60/212,711, filed on Jun. 20, 2000.

(51) Int. Cl.[7] ............................................... G01R 31/02
(52) U.S. Cl. ...................... 324/758; 324/754; 324/158.1
(58) Field of Search ................................ 324/754–765, 324/158.1, 72.5, 751, 752, 753; 439/482, 770; 29/889.04

(56) References Cited

U.S. PATENT DOCUMENTS

| | | | | |
|---|---|---|---|---|
| 4,975,637 A | * | 12/1990 | Frankeny et al. | ............ 324/760 |
| 5,384,531 A | * | 1/1995 | Yamazaki et al. | ........... 324/765 |
| 5,773,987 A | * | 6/1998 | Montoya | ..................... 324/757 |
| 5,804,983 A | * | 9/1998 | Nakajima et al. | ............ 324/758 |
| 5,986,459 A | * | 11/1999 | Fukaya et al. | .............. 324/755 |
| 6,043,667 A | * | 3/2000 | Cadwallader et al. | ....... 324/758 |

* cited by examiner

Primary Examiner—Kamand Cuneo
Assistant Examiner—Jimmy Nguyen
(74) Attorney, Agent, or Firm—Steubing McGuinness & Manaras LLP

(57) ABSTRACT

Apparatus and methods are provided for automated semiconductor device probing. The apparatus includes a probe assembly; a machine vision system; and a semiconductor support fixture. A method includes providing apparatus for automated semiconductor device probing; locating the semiconductor device positioned on the semiconductor support fixture with the machine vision system; guiding the movement of at least one of the probe assembly and the semiconductor support fixture so as to position a contact portion of the semiconductor device and the electrical probe in alignment with one another; and moving at least one of the probe assembly and the semiconductor support fixture toward the other of the at least one of the probe assembly and the semiconductor support fixture so as to position the electrical probe and the contact portion of the semiconductor device in electrical connection with one another.

50 Claims, 4 Drawing Sheets

AUTOMATED SEMICONDUCTOR PROBING DEVICE

REFERENCE TO PENDING PRIOR PATENT APPLICATION

This patent application claims benefit of prior U.S. Provisional Patent Application Ser. No. 60/212,711, filed Jun. 20, 2000 by Yakov Kogan et al. for AUTOMATED SEMICONDUCTOR PROBING DEVICE, which patent application is hereby incorporated herein by reference.

FIELD OF THE INVENTION

This invention relates to semiconductor chip testing apparatus and methods in general, and more particularly to apparatus and methods for automated semiconductor chip testing.

BACKGROUND OF THE INVENTION

Semiconductor devices, such as wafer chips, often require testing and/or assembly with electrical probes attached thereto. These processes may simultaneously require precise optical alignment and electrical connection. This can be especially important during chip-level testing and assembly of opto-electronic devices.

In addition, semiconductor device testing and/or assembly may require movement of the device with electrical probes attached thereto. Such a freedom of motion may significantly increase the efficiency of the testing and/or assembly of the device.

In known testing and assembly systems, this range of motion is typically achieved by taking advantage of the compliance of the electrical probes. However, such compliance is typically quite limited and does not permit movement of any significant distance. The optical alignment and electrical connection of the device may also be adversely affected by using the compliance of the electrical probes to achieve a range of motion.

SUMMARY OF THE INVENTION

Accordingly, one object of the present invention is to provide a device for precisely placing an electrical probe on a semiconductor chip.

Another object of the invention is to provide a device for automatically and precisely placing an electrical probe on a semiconductor chip.

A further object of the invention is to provide a device for automatically and precisely placing an electrical probe on a semiconductor chip that allows movement of the chip with the probes attached thereto.

A still further object of the invention is to provide a method for automatically and precisely placing an electrical probe on a semiconductor chip that allows movement of the chip with the probes attached thereto.

With the above and other objects in view, as will hereinafter appear, there is provided an apparatus for automated semiconductor device probing, the apparatus comprising: a probe assembly including an electrical probe for making an electrical connection with a semiconductor device, the probe assembly having a first surface and a second surface in opposition to one another; a machine vision system having a camera for locating the semiconductor device, the machine vision system having a first contact surface adjacent the first surface of the probe assembly, the first contact surface having a first attachment mechanism to selectively attach together the probe assembly and the machine vision system; and a semiconductor support fixture for positioning the semiconductor device, the semiconductor support fixture having a second contact surface adjacent the second surface of the probe assembly, the second contact surface having a second attachment mechanism to selectively attach together the probe assembly and the semiconductor support fixture.

In accordance with a further feature of the invention there is provided a method for automated semiconductor device probing, the method comprising:

providing apparatus for automated semiconductor device probing, the apparatus comprising: a probe assembly including an electrical probe for making an electrical connection with a semiconductor device, the probe assembly having a first surface and a second surface in opposition to one another; a machine vision system having a camera for locating the semiconductor device, the machine vision system having a first contact surface adjacent the first surface of the probe assembly, the first contact surface having a first ale attachment mechanism to selectively attach together the probe assembly and the machine vision system; and a semiconductor support fixture for positioning the semiconductor device, the semiconductor support fixture having a second contact surface adjacent the second surface of the probe assembly, the second contact surface having a second attachment mechanism to selectively attach together the probe assembly and the semiconductor support fixture;

locating the semiconductor device positioned on the semiconductor support fixture with the machine vision system;

guiding the movement of at least one of the probe assembly and the semiconductor support fixture so as to position a contact portion of the semiconductor device and said electrical probe in alignment with one another; and moving at least one of the probe assembly and the semiconductor support fixture toward the other of the at least one of the probe assembly and the semiconductor support fixture so as to position the electrical probe and the contact portion of the semiconductor device in electrical connection with one another.

The above and other features of the invention, including various novel details of construction and combinations of parts and method steps, will now be more particularly described with reference to the accompanying drawings and pointed out in the claims. It will be understood that the particular devices and method steps embodying the invention are shown by way of illustration only and not as limitations of the invention. The principles and features of this invention may be employed in various and numerous embodiments without departing from the scope of the invention.

BRIEF DESCRIPTION OF THE DRAWINGS

These and other objects and features of the present invention will be more fully disclosed by the following detailed description of the preferred embodiments of the invention, which are to be considered together with the accompanying drawings wherein like numbers refer to like parts, and further wherein.

DETAILED DESCRIPTION OF THE PREFERRED EMBODIMENTS

Figure 1:
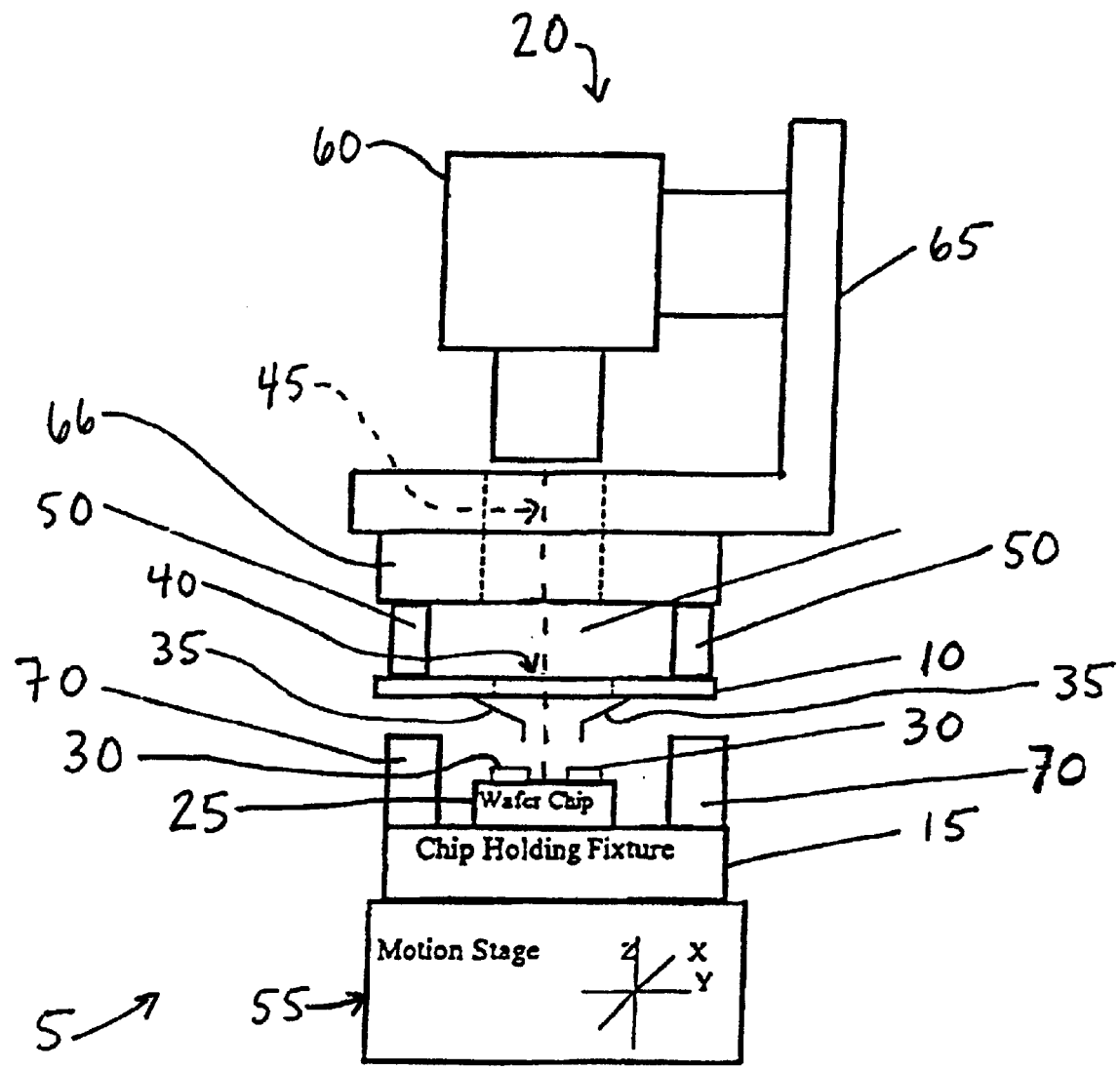
FIG. 1 is a diagrammatic illustration of an automated semiconductor probing device, with the device being shown with its probe assembly in contact with the machine vision system.
Figure 2:
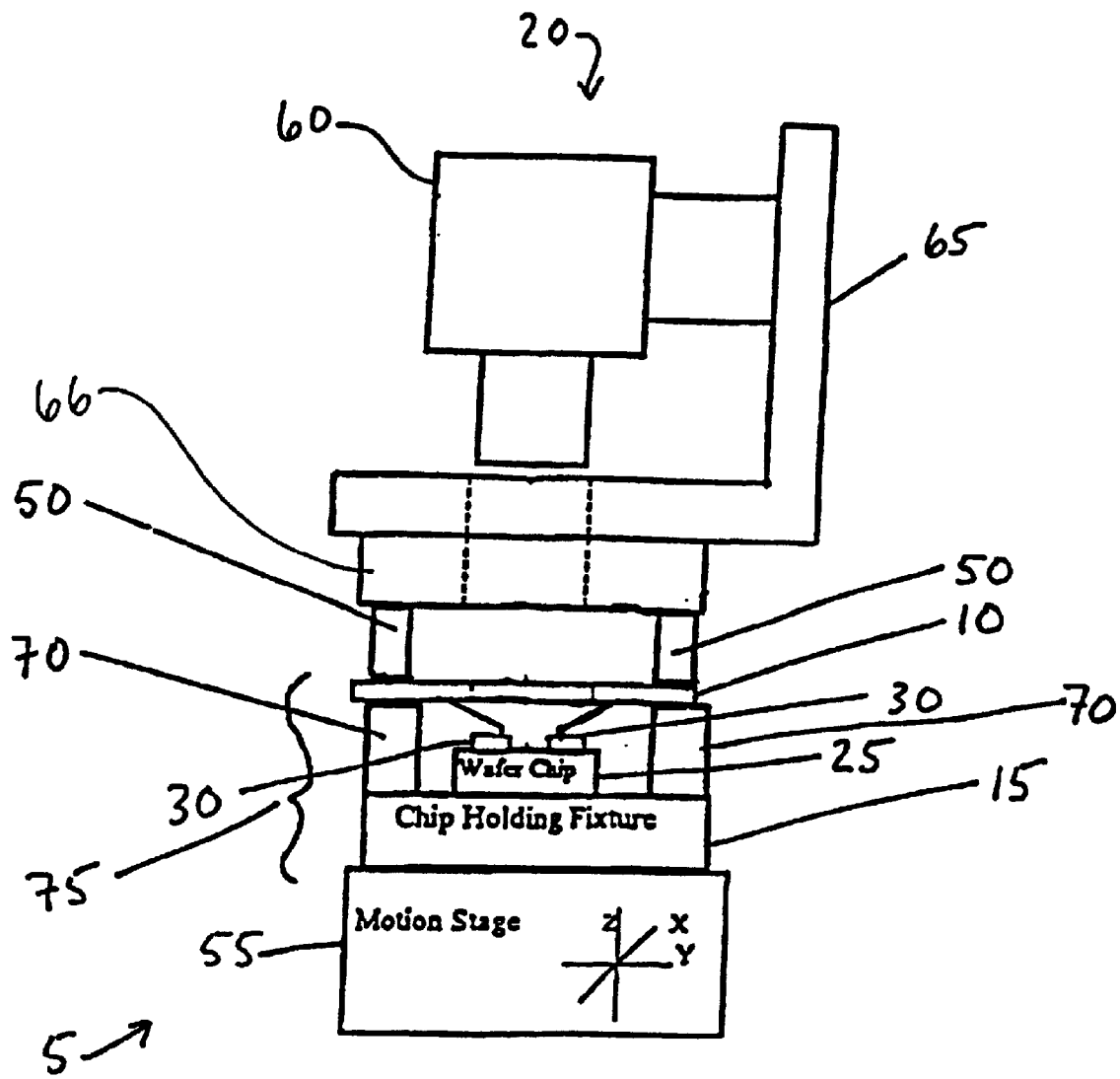
FIG. 2 is a diagrammatic illustration of an automated semiconductor probing device, with the device being shown with its probe assembly in contact with both the machine vision system and the semiconductor support system.
Figure 3:
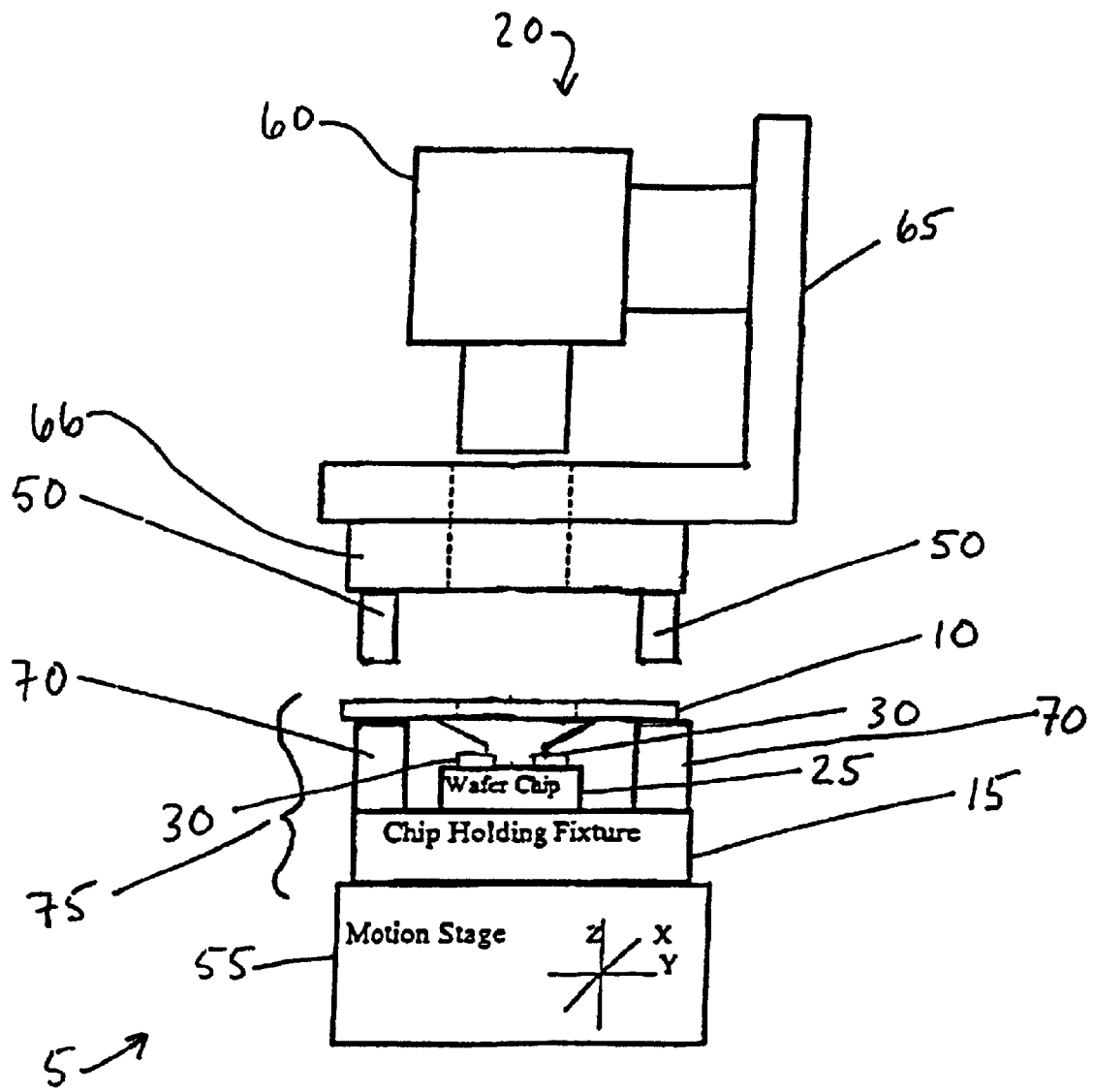
FIG. 3 is a diagrammatic illustration of an automated semiconductor probing device, with the device being shown with its probe assembly in contact with the semiconductor device.

A preferred embodiment of the present invention is shown in FIGS. 1–3. More particularly, there is shown an automated semiconductor probing device 5 which generally comprises a probe assembly 10, a semiconductor support fixture 15, and a machine vision system 20. A semiconductor device 25 is shown supported on semiconductor support fixture 15. Machine vision system 20 is used to locate semiconductor device 25 in relation to probe assembly 10. Semiconductor support fixture 15 and/or probe assembly 10 are moved as guided by machine vision system 20 to precisely align semiconductor device 25 with probe assembly 10. Semiconductor support fixture 15 and/or machine vision system 20 are then moved toward the other such that probe assembly 10 makes an electrical connection with a contact portion of semiconductor device 25. Probe assembly 10 is then transferred from machine vision system 20 to semiconductor support fixture 15, where the probe assembly remains as the semiconductor support fixture 15 moves away from machine vision system 20. Thereafter, probe assembly 10 may be transferred back to machine vision system 20 for use on a subsequent chip.

Referring again to FIGS. 1–3, in a preferred embodiment of the invention, semiconductor device 25 is a wafer chip that contains a pair of contact pads 30. In other preferred embodiments of the present invention (not shown), semiconductor device 25 may contain a single contact pad where another electrical connection is made at its bottom surface or on a side portion. Alternatively, semiconductor device 25 may have more than two contact pads thereon.

Still looking at FIGS. 1–3, in a preferred embodiment of the invention, probe assembly 10 is shown with a pair of electrical probes 35. Electrical probes 35 are configured to selectively make contact with the two contact pads 30. Of course, where appropriate, probe assembly 10 may have more or less than two electrical probes 35. More particularly, in other preferred embodiments of the present invention (not shown), a probe assembly may have a single electrical probe or multiple probes. These probes can be configured to selectively make contact with a single contact pad or multiple contact pads of a semiconductor device.

Looking now in FIGS. 1–3, an opening 40 is provided in probe assembly 10 so as to create an optical path, along an optical axis 45, formed between machine vision system 20 and semiconductor support fixture 15.

Referring again to FIGS. 1–3, in the preferred embodiment of the present invention, machine vision system 20 is shown including a first attachment mechanism 50. Probe assembly 10 may be selectively attached to first attachment mechanism 50. For example, this attachment may include the use of an electromagnet, vacuum force or a mechanical connection. In use, first attachment mechanism 50 the electromagnet may be actuated by electrical current to attach probe assembly 10 thereto. Additionally the attachment mechanism may provide a fail safe mechanism to prevent probe assembly 10 from becoming released from machine vision system 20 during a loss of power. As such, in the event of power loss, probe assembly 10 is retained to machine vision system 20 in the absence of electrical current.

Still looking at FIGS. 1–3, in a preferred embodiment of the present invention, semiconductor support fixture 15 is shown positioned on a motion stage 55. Motion stage 55 is used to move semiconductor support fixture 15 and, in turn, semiconductor device 25 relative to probe assembly 10 in the X-direction, the Y-direction and the Z-direction. Motion stage 55 is also guided by machine vision system 20.

Referring again to FIGS. 1 and 2, machine vision system 20 is shown including a camera 60 in attachment to a support 65. Support 65 is shown with a first attachment mechanism 50. Camera 60 is configured to locate the position of semiconductor device 25 in relation to the position of probe assembly 10. More particularly, camera 60 locates the position of contact pads 30 in relation to electrical probes 35. Using this location information, machine vision system 20 guides motion stage 55 so as to position semiconductor support 15 in the X-direction and/or the Y-direction. This positioning is continued until contact pads 30 are positioned in alignment with electrical probes 35.

Still looking at FIGS. 1–3, semiconductor support fixture 15 is shown including a second attachment mechanism 70. Probe assembly 10 may be selectively attached to second mechanism 70. For example, this attachment may include the use of an electromagnet, vacuum force or a mechanical connection. The attachment mechanism 70 may be actuated by an electrical current to attach probe assembly 10 thereto after alignment of contact pads 30 and electrical probes 35.

Now looking at FIG. 1, semiconductor probing device 5 is shown with probe assembly 10 in attachment to first attachment mechanism 50. In this configuration, probe assembly 10 and/or semiconductor support fixture 15 may be moved relative to one another such that electrical probes 35 and contact pads 30 may be aligned with one another. After aligning electrical probes 35 and contact pads 30, probe assembly and semiconductor support fixture 15 are locked into this position relative to one another. In a preferred embodiment of the present invention, semiconductor support fixture 15 is then moved in the Z-direction toward probe assembly 10 until electronic probes 35 make electrical connection with contact pads 30. See FIG. 2. At this point, an electric signal may be applied to, and/or read back from, semiconductor device 25.

Now looking at FIG. 2, in a preferred embodiment of the present invention, probe assembly 10 is adjacent to second attachment mechanism 70 as electronic probes 35 simultaneously become electrically connected with contact pads 30. In addition, second attachment mechanism 70 may be activated to attach probe assembly 10 and semiconductor support fixture 15 to one another. This attachment acts to preserve the alignment of, and electrical connection between, electronic probes 35 and contact pads 30.

Furthermore, first attachment mechanism 50 may be deactivated to detach probe assembly 10 and support 65 from one another. Upon this deactivation, probe assembly 10 and semiconductor support fixture 15 are left in attachment to one another, effectively forming a single unit 75. Accordingly, probe assembly 10 is no longer secured to machine vision system 20. Single unit 75, on motion stage 55, can now be moved a significant distance, in any direction, from machine vision system 20. See FIG. 3. This motion permits more extensive manipulation of semiconductor device 25 at the chip level allowing precise optical alignment while maintaining electrical connection to semiconductor device 25. As such, the probe assembly 10 can remain mated to semiconductor device 25 while tests and operations are performed on the semiconductor device 25, e.g. calibration, optical alignment, laser trimming, etc.

After testing and/or assembly is completed on semiconductor device 25, single unit 75 is returned to interface with machine vision system 20 at first attachment mechanism 50. This is done by appropriately moving motion stage 55 first in the X and Y directions, and then in the Z direction. See FIG. 2. First attachment mechanism 50 is then activated once more to attach probe assembly 10 and semiconductor support fixture 15 to one another. Then second attachment mechanism 70 is deactivated so as to detach probe assembly 10 and semiconductor support fixture 15 from one another. Upon this deactivation, semiconductor support fixture 15 may be then be moved away from probe assembly 10 to permit removal of semiconductor device 25. See FIG. 1. Another semiconductor device (not shown) may then be positioned on semiconductor support fixture 15 for automated semiconductor device probing as described herein.

In addition, an alignment mechanism (not shown) may be provided to align probe assembly 10 and machine vision system 20 to one another during engagement with one another. This alignment mechanism (not shown) may include in intermeshing surfaces on probe assembly 10 and machine vision System 20. This alignment mechanism (not shown) may be provided to prevent incremental misalignment between probe assembly 10 and machine vision system 20 over time, as probe assembly 10 is repeatedly redocked to machine vision system 20.

In another preferred embodiment of the invention (not shown), multiple semiconductor devices 25 can be positioned at a single time on semiconductor support fixture 15. Machine vision system 20 and probe assembly 10 can then be sequentially used on each of semiconductor devices 25 as described herein.

Figure 4:
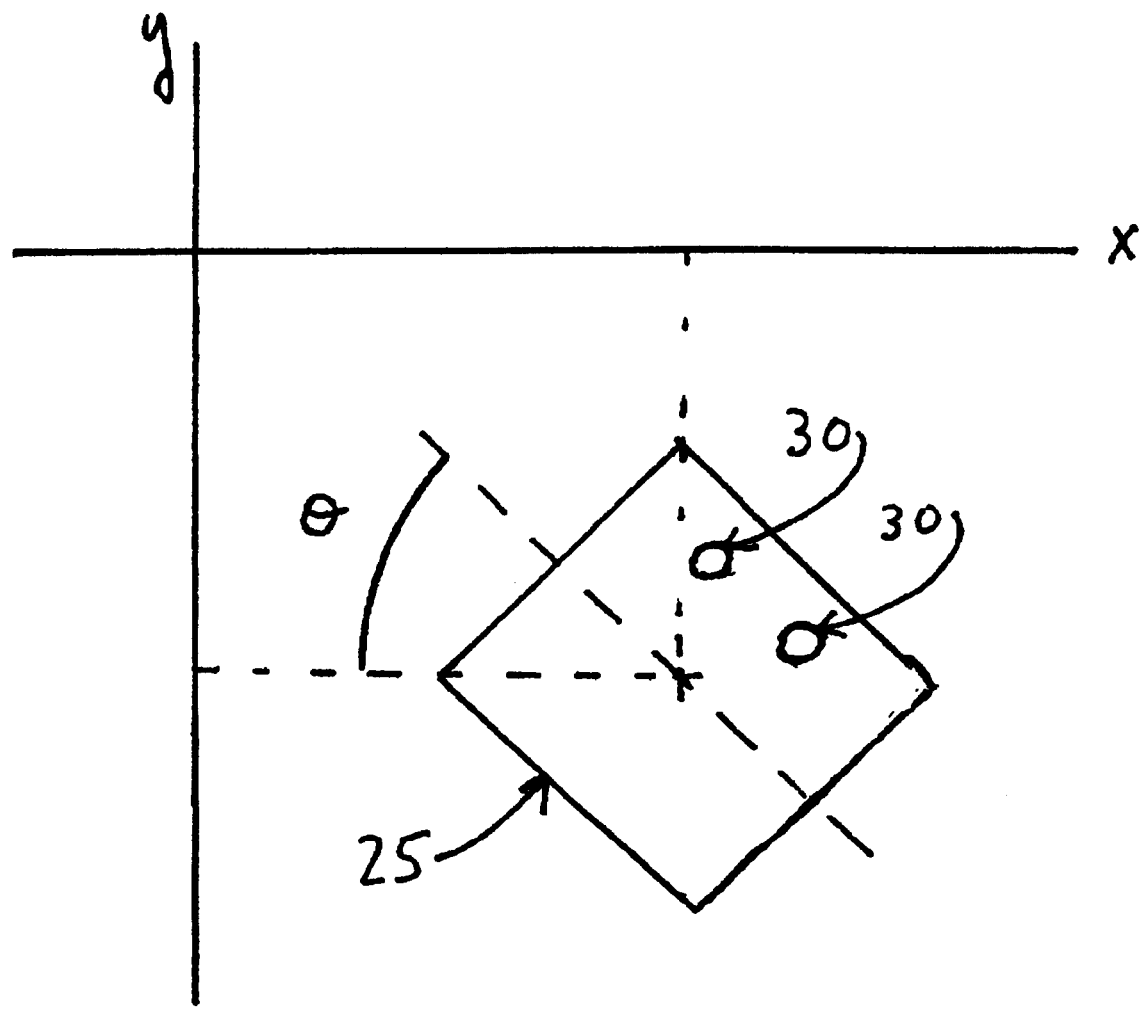
FIG. 4 is a schematic top view of a semiconductor device.

Looking now at FIGS. 1 and 4, in another preferred embodiment of the present invention, semiconductor device 25 is shown positioned on semiconductor support fixture 15 at an angle θ (FIG. 4) with respect to the X, Y plane of probe apparatus 10 and machine vision system 20 (FIG. 1).

One method to compensate for this angle θ is to employ the machine vision system 20 to determine this angle θ and adjust the position of probe assembly 10 with respect to semiconductor device 25. This adjustment can be made by rotating first attachment mechanism 50 and probe assembly 10 as guided by machine vision system 20. More particularly, a rotatable mount 66 may be included between first attachment mechanism 50 and support 65. As such, the rotatable mount 66 turns probe assembly 10 to angle θ with respect to machine vision system 20, aligning electronic probes 35 with contact pads 30. Once this alignment is made, the automatic probing process continues as described herein. This rotary orientation serves to correct any angular deviation between contact pads 30 and electronic probes 35 in the horizontal plane. This may be important to allow automated probing of "randomly" positioned semiconductor devices 25 on semiconductor support fixture 15.

In another preferred embodiment of the invention (not shown), a precision mount (not shown) may be used to rotate motion stage 55, As such, a rotational deviation between a semiconductor device 25 and a probe assembly 10, shown as angle θ in FIG. 4, may be corrected by rotating motion stage 55.

What is claimed is:

1. Apparatus for automated semiconductor device probing, said apparatus comprising:

a probe assembly including an electrical probe for making an electrical connection with a semiconductor device, said probe assembly having a first surface and a second surface in opposition to one another;

a machine vision system having a camera for locating said semiconductor device, said machine vision system having a first contact surface adjacent said first surface of said probe assembly, said first contact surface having a first attachment mechanism to selectively attach or detach said probe assembly and said machine vision system; and a semiconductor support fixture for positioning said semiconductor device, said semiconductor support fixture having a second contact surface adjacent said second surface of said probe assembly, said second contract surface having a second attachment mechanism to selectively attach together said probe assembly and said semiconductor support fixture.

2. Apparatus according to claim 1 further comprising at least one of said probe assembly and said semiconductor support fixture being selectively movable in a plane substantially orthogonal to a line extending between said probe assembly and said semiconductor support fixture.

3. Apparatus according to claim 2 further comprising said probe assembly being selectively movable toward said semiconductor support fixture along a line, and said semiconductor support fixture being selectively movable toward the probe assembly along the line, wherein the line extends between said probe assembly and said semiconductor support fixture.

4. Apparatus according to claim 3 wherein said machine vision system locates said semiconductor device positioned on said semiconductor support fixture, and said machine vision system guides the movement of at least one of said probe assembly and said semiconductor support fixture so as to position a contact portion of said semiconductor device and said electrical probe in alignment with one another, and wherein at least one of said probe assembly and said semiconductor support fixture is moved toward the other of said at least one of said probe assembly and said semiconductor support fixture so as to position said electrical probe and said contact portion of said semiconductor device in electrical connection with one another.

5. Apparatus according to claim 1 wherein said probe assembly comprises two electrical probes.

6. Apparatus according to claim 1 wherein said first attachment mechanism is an electromagnet.

7. Apparatus according to claim 1 wherein said second attachment mechanism is an electromagnet.

8. Apparatus according to claim 1 wherein said first attachment mechanism provides a fail safe mechanism to selectively attach together said probe assembly and said machine vision system so as to prevent said probe assembly from falling during a loss of power.

9. Apparatus according to claim 1 wherein said probe assembly and said machine vision system further comprises an alignment mechanism to align one another during engagement with one another.

10. Apparatus according to claim 1 further comprising a motion stage wherein said semiconductor support fixture is mounted on said motion stage.

11. Apparatus according to claim 10 wherein said motion stage moves in a plane orthogonal to the view of said camera of said machine vision system.

12. Apparatus according to claim 1 wherein said semiconductor support fixture is selectively movable in a plane substantially orthogonal to a line extending between said probe assembly and said semiconductor support fixture.

13. Apparatus according to claim 1 wherein said probe assembly is selectively movable in a plane substantially orthogonal to a line extending between said probe assembly and said semiconductor support fixture.

14. Apparatus according to claim 1 wherein said semiconductor support fixture and said probe assembly are each selectively movable in first and second planes substantially orthogonal to a line extending between said probe assembly and said semiconductor support fixture, respectively.

15. Apparatus according to claim 1 wherein said semiconductor support fixture is selectively movable toward said probe assembly.

16. Apparatus according to claim 10 wherein said probe assembly is selectively movable toward said semiconductor support fixture.

17. Apparatus according to claim 1 wherein said probe assembly and said semiconductor support fixture are each selectively movable toward each other.

18. Apparatus according to claim 10 wherein said machine vision system locates said semiconductor device to guide the movement of said motion stage so as to position a contact potion of said semiconductor device and said electrical probe in alignment with one another.

19. Apparatus according to claim 10 wherein said motion stage moves said semiconductor support fixture toward said probe assembly so as to position said electrical probe and said contact portion of said semiconductor device in electrical connection with one another.

20. Apparatus according to claim 1 wherein said second surface of said probe assembly contacts said second attachment mechanism of said semiconductor support fixture as said electrical probe and a contact portion of said semiconductor device are in electrical connection with one another.

21. Apparatus according to claim 1 wherein said first attachment mechanism attaches together said probe assembly and said machine vision system as said contact portion of said semiconductor device and said electrical probe are being positioned in alignment with one another.

22. Apparatus according to claim 21 wherein said second attachment mechanism attaches together said probe assembly and sand semiconductor support fixture after said electrical probe and said semiconductor device are in electrical connection with one another.

23. Apparatus according to claim 22 wherein said first attachment mechanism releases said probe assembly from said machine vision system after said second attachment means attaches together said probe assembly and said semiconductor support fixture.

24. Apparatus according to claim 23 wherein said probe assembly and said semiconductor support fixture are moved as a single unit away from said machine vision system.

25. Apparatus according to claim 24 wherein an electrical signal is applied by said electrical probe to said contact portion of said semiconductor device.

26. Apparatus according to claim 24 wherein said electrical probe reads an electrical signal back from said contact portion of said semiconductor device.

27. Apparatus according to claim 24 wherein said semiconductor device is assembled with said electrical probe, in electrical contact with one another.

28. Apparatus according to claim 24 wherein said probe assembly and said semiconductor support fixture are moved as said single unit back to said machine vision system.

29. Apparatus according to claim 28 wherein said first attachment mechanism reattaches together said probe assembly and said machine vision system after said single unit is moved back to said machine vision system.

30. Apparatus according to claim 29 wherein said second attachment mechanism releases said probe assembly from said semiconductor support fixture after said first attachment mechanism reattaches together said probe assembly and said machine vision system.

31. Apparatus according to claim 30 wherein said semiconductor support fixture is moved away from said probe assembly after said second attachment mechanism releases said probe assembly from said semiconductor support fixture.

32. Apparatus according to claim 1 wherein an electrical signal is applied by said electrical probe to said contact portion of said semiconductor device.

33. Apparatus according to claim 1 wherein said electrical probe reads an electrical signal back from said contact portion of said semiconductor device.

34. Apparatus according to claim 1 wherein said semiconductor device is assembled with said electrical probe, in electrical contact with one another.

35. A method for automated semiconductor device probing, said method comprising:

probing apparatus for automated semiconductor device probing, said apparatus comprising:
a probe assembly including an electrical probe for making an electrical connection with a semiconductor device, said probe assembly having a first surface and a second surface in opposition to one another;
a machine vision system having a camera for locating said semiconductor device, said machine vision system having a first contact surface adjacent said first surface of said probe assembly, said first contact surface having a first attachment mechanism to selectively attach or detach said probe assembly and said machine vision system; and
a semiconductor support fixture for positioning said semiconductor device, said semiconductor support fixture having a second contact surface adjacent said second surface of said probe assembly, said second contact surface having a second attachment mechanism to selectively attach together said probe assembly and said semiconductor support fixture;
locating said semiconductor device positioned on said semiconductor support fixture with said machine vision system;
guiding the movement of at least one of said probe assembly and said semiconductor support fixture so as to position a contact portion of said semiconductor device and said electrical probe in alignment with one another; and
moving said probe assembly towards said semiconductor support fixture and moving said semiconductor support fixture toward said probe assembly so as to position said electrical probe and said contact portion of said semiconductor device in electrical connection with one another.

36. A method according to claim 35 wherein said apparatus further comprises at least one of said probe assembly and said semiconductor support fixture being selectively movable in a plane substantially orthogonal to a line extending between said probe assembly and said semiconductor support fixture.

37. A method according to claim 36 wherein said apparatus further comprises at least one of said probe assembly and said semiconductor support fixture being selectively movable toward the other of said at least one of said probe assembly and said semiconductor support fixture along a line extending between said probe assembly and said semiconductor support fixture.

38. A method according to claim 35 further comprising the step of attaching together said probe assembly and said machine vision system at said first attachment mechanism prior to the step of guiding the movement of at least one of said probe assembly and said semiconductor support fixture to position said contact portion of said semiconductor device in alignment with said electrical probe.

39. A method according to claim 38 further comprising the step of attaching together said probe assembly and said semiconductor support fixture at said second attachment mechanism after the step of moving at least one of said probe assembly and said semiconductor support fixture toward the other of said at least one of said probe assembly and said semiconductor support fixture to position said electrical probe and said contact portion of said semiconductor device in electrical connection with one another.

40. A method according to claim 39 further comprising the step of releasing said probe assembly from machine vision system at said first attachment mechanism after the step of attaching together said probe assembly and said semiconductor support fixture at said second attachment mechanism.

41. A method according to claim 40 further comprising the step of moving said probe assembly and said semiconductor support fixture as a single unit away from said machine vision system after the step of releasing said probe assembly from said machine vision system at said first attachment mechanism.

42. A method according to claim 41 further comprising the step of applying an electrical signal by said electrical probe to said contact portion of said semiconductor device.

43. A method according to claim 41 further comprising the step of reading back an electrical signal from said contact portion of said semiconductor device by said electrical probe.

44. A method according to claim 41 further comprising assembling said semiconductor device with said electrical probe, in electrical contact with one another.

45. A method according to claim 41 further comprising the step of moving said probe assembly and said semiconductor support fixture attached together as said single unit back to said machine vision system.

46. A method according to claim 45 further comprising the step of reattaching together said probe assembly and said machine vision system after the step of moving said probe assembly and said semiconductor support fixture attached together as said single unit back to said machine vision system.

47. A method according to claim 46 further comprising the step of releasing said probe assembly from said semiconductor support fixture after the step of reattaching together said probe assembly and said machine vision system.

48. A method according to claim 47 further comprising the step of moving away said semiconductor support fixture from said probe assembly after the step of releasing said probe assembly from said semiconductor support fixture.

49. A method according to claim 48 further comprising the step of removing said semiconductor device from said semiconductor support fixture and placing another semiconductor device on said semiconductor support fixture.

50. A method according to claim 35 further comprising the step of moving said semiconductor support to probe another semiconductor device contained on said semiconductor support fixture.

* * * * *